United States Patent

Ogawa et al.

[11] Patent Number: 5,986,445
[45] Date of Patent: Nov. 16, 1999

[54] CROSS-COIL TYPE INDICATING INSTRUMENT HAVING A ZERO-RETURN MAGNETIC PROJECTION MEMBER

[75] Inventors: Naoto Ogawa; Isao Miyagawa, both of Kariya; Takashi Koumura, Toyoya, all of Japan

[73] Assignee: Denso Corporation, Kariya, Japan

[21] Appl. No.: 09/234,982

[22] Filed: Jan. 22, 1999

[30] Foreign Application Priority Data

| Feb. 13, 1998 | [JP] | Japan | 10-031747 |
| Apr. 10, 1998 | [JP] | Japan | 10-099358 |
| May 11, 1998 | [JP] | Japan | 10-127683 |
| May 11, 1998 | [JP] | Japan | 10-127684 |

[51] Int. Cl.$^6$ ............................................. G01R 1/20
[52] U.S. Cl. ............................................. 324/146; 324/144
[58] Field of Search ........................... 324/117 R, 143, 324/146, 144, 145, 151 R, 154 R, 166, 167; 335/222; 336/220, 221, 188

[56] References Cited

U.S. PATENT DOCUMENTS

| 4,492,920 | 1/1985 | Reenstra | 324/146 |
| 4,724,601 | 2/1988 | MacManus et al. | 324/146 |
| 5,146,158 | 9/1992 | Ooike | 324/146 |
| 5,243,277 | 9/1993 | Totsuka et al. | 324/146 |

FOREIGN PATENT DOCUMENTS

| 62-17714 | 5/1987 | Japan. |
| 63-31012 | 8/1988 | Japan. |
| 2-147960 | 6/1990 | Japan. |

*Primary Examiner*—Jay Patidar
*Attorney, Agent, or Firm*—Pillsbury Madison & Sutro LLP

[57] ABSTRACT

A cross-coil type indicating instrument includes a bobbin, a cross-coil unit disposed around the bobbin, a shaft, a permanent magnet rotor disposed inside the bobbin, a dial having a zero position, a pointer carried by the shaft, and a magnetic shield casing for accommodating the bobbin. The magnetic shield casing has a projection member extending from the bottom thereof at a peripheral side of the cross-coil unit to meet one of magnetic poles of the permanent magnet when the pointer returns to the zero-position.

10 Claims, 4 Drawing Sheets

CROSS-COIL TYPE INDICATING INSTRUMENT HAVING A ZERO-RETURN MAGNETIC PROJECTION MEMBER

CROSS REFERENCE TO RELATED APPLICATION

The present application is based on and claims priority from Japanese Patent Applications Hei 10-31747 filed on Feb. 13, 1998, Hei 10-99358 filed on Apr. 10, 1998, Hei 10-127683 filed on May 11, 1998, and Hei 10-127684 filed on May 11, 1998, the contents of which are incorporated herein by reference.

BACKGROUND OF THE INVENTION

1. Field of the Invention

The present invention relates to a cross-coil type indicating instrument for use in a vehicle or a general industrial apparatus.

2. Description of the Related Art

JP-Y2-62-17714 discloses a cross-coil type indicating instrument which has a dial, a pointer shaft, a hollow cylindrical bobbin, a disk-like rotary permanent magnet, a cross coil unit composed of a pair of coils crossing each other and disposed around the bobbin, and a cup-shaped shield casing. The bobbin rotatably supports the pointer shaft and accommodates the rotary permanent magnet in the central space thereof. The shaft and pointer are driven by the cross-coil unit when it is energized. The cup-shaped shield casing has a projection projecting radially inner side from the side wall to magnetically attract the rotary permanent magnet stronger than other portions so that the pointer can stay at the zero position of the dial when the cross-coil unit is deenergized.

However, a considerably large-sized projection has to be formed on the side wall of the casing to assure the zero-return function. This makes the casing and the indicating instrument bigger.

SUMMARY OF THE INVENTION

A main object of the invention is to provide a compact cross-coil type indicating instrument that has the zero-return function.

In a cross-coil type indicating instrument according to a main feature of the invention, a magnetic shield casing for accommodating a bobbin for a cross-coil unit is provided with a projection member extending from the bottom of the shield casing at a peripheral side of the cross-coil unit to meet one of magnetic poles of a permanent magnet rotor when a pointer returns to the zero-position of a dial.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

DETAILED DESCRIPTION OF THE PREFERRED EMBODIMENTS

First Embodiment

Figure 1:
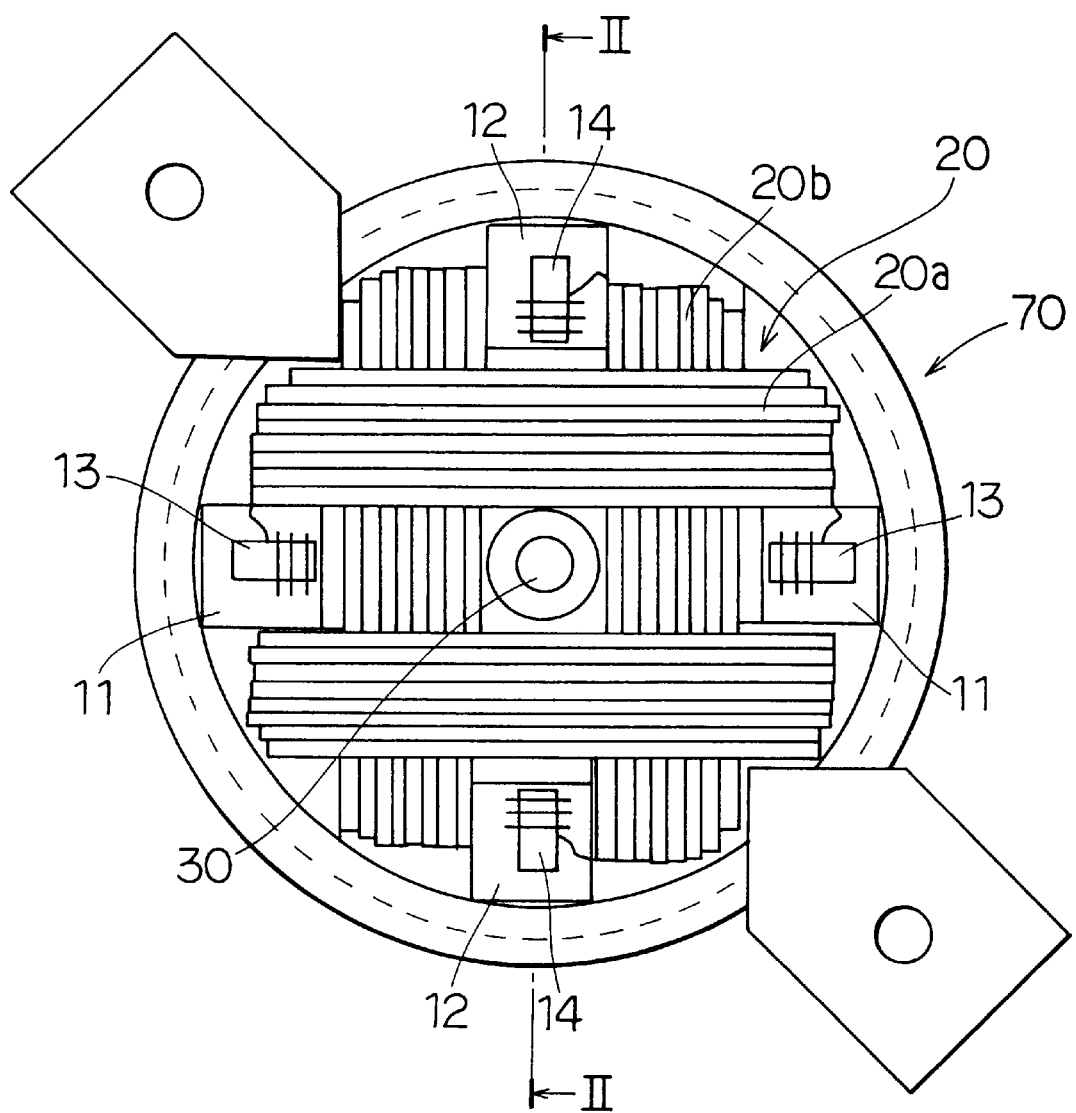
FIG. 1 is a cross-sectional plan view illustrating a main portion of a cross-coil type indicating instrument according to a preferred embodiment of the invention.

A cross-coil type indicating instrument to be mounted in a vehicle according to a preferred embodiment of the invention is described with reference to FIGS. 1–5A and 5B. The indicating instrument is composed of hollow cylindrical bobbin 10, cross-coil unit 20, steel shaft 30, dial 40, ferrite permanent magnet rotor 50, pointer 60 and magnetic shield casing 70.

Figure 2:
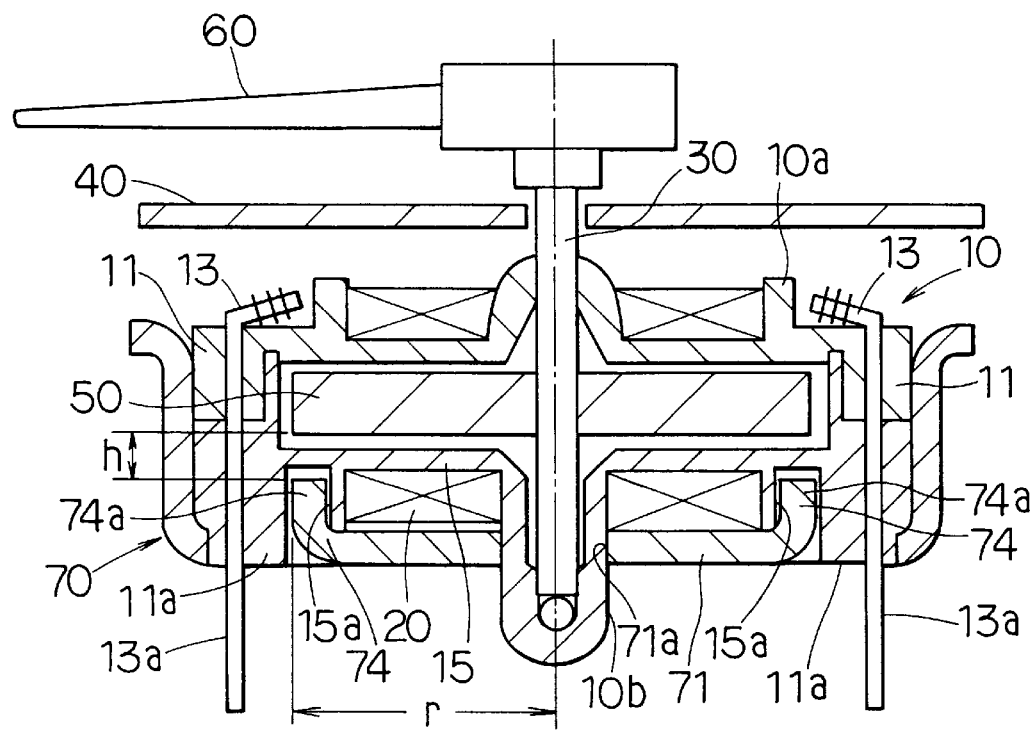
FIG. 2 is a cross sectional side view of the indicating instrument cut along a line II—II in FIG. 1.

Bobbin 10 is disposed in magnetic shield casing 70 and is composed of upper bobbin member 10a and lower bobbin member 10b coupled together. Lower bobbin member 10b has bottom 15 and a center cylinder extending downward from bottom 15 through center hole 71a formed in the bottom of magnetic shield casing 70. Bobbin 10 has terminal holders 11, 12 extending in the axial direction at the outer periphery thereof as shown in FIGS. 1 and 2. Terminal holders 11, 12 are disposed at equal intervals (e.g. 90° in angle) to be symmetrical about shaft 30. A pair of terminal holders 11 holds a pair of axially extending terminals 13 made of phosphor bronze or the like, and a pair of terminal holders 12 hold a pair of axially extending terminals 14 made of phosphor bronze or the like.

Cross-coil unit 20 is disposed at the outer periphery of bobbin 10 and is composed of a pair of coils 20a, 20b crossing each other at right angles. Coil 20b is wound around a horizontal axis and coil 20a is wound around a vertical axis and on coil 20b as shown in FIG. 1. Each of the pair of coils 20a, 20b is divided by terminal holders 11, 12 into two sections as shown in FIG. 1. One of the pair of coils 20a, 20b is connected to the pair of terminals 13 at the upper end thereof and the other is connected to the pair of terminals 14 at the upper end thereof. Cross-coil unit 20 generates a composite magnetic field when energized by a drive circuit (not shown).

Steel shaft 30 is rotatably supported by bobbin 10 at the center thereof and extends forward through a center hole of dial 40. Shaft 30 is fixed at the middle to permanent magnet rotor 50 to be rotated thereby. Shaft 30 is supported by the center cylinder of lower bobbin member 10b.

Permanent magnet rotor 50 is disposed inside bobbin 10 and partially immersed in silicone oil to be rotated under the composite magnetic field generated by cross-coil unit 20. A pair of magnetic poles 51 (e.g. N-pole), 52 (e.g. S-pole) are formed at opposite portions of the outer periphery of permanent magnet rotor 50.

Pointer 60 is carried by shaft 30 at the tip thereof to swing over the front surface of dial 40, thereby indicating engine rotation, vehicle speed or the like.

Figure 3:
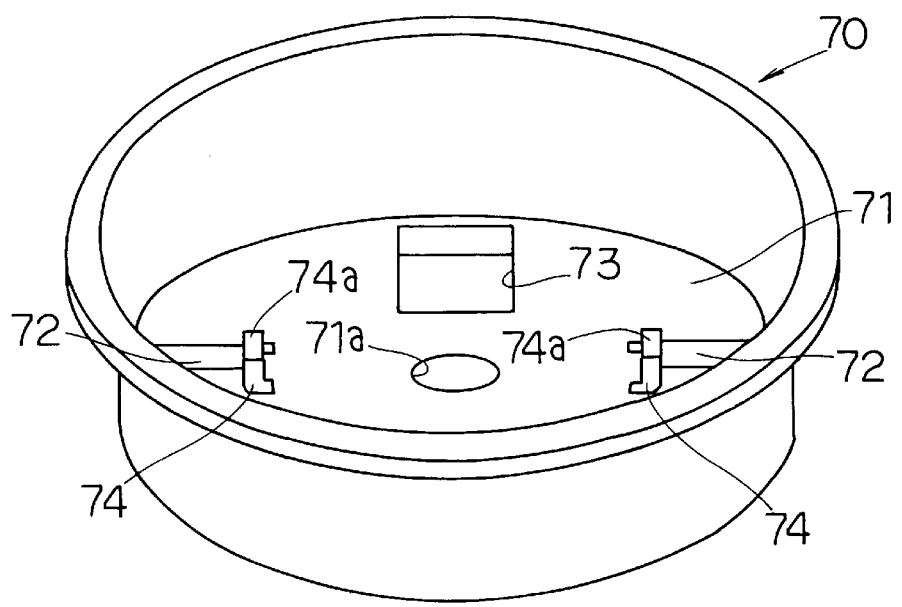
FIG. 3 is a perspective view of a magnetic shield casing of the indicating instrument.
Figure 4:
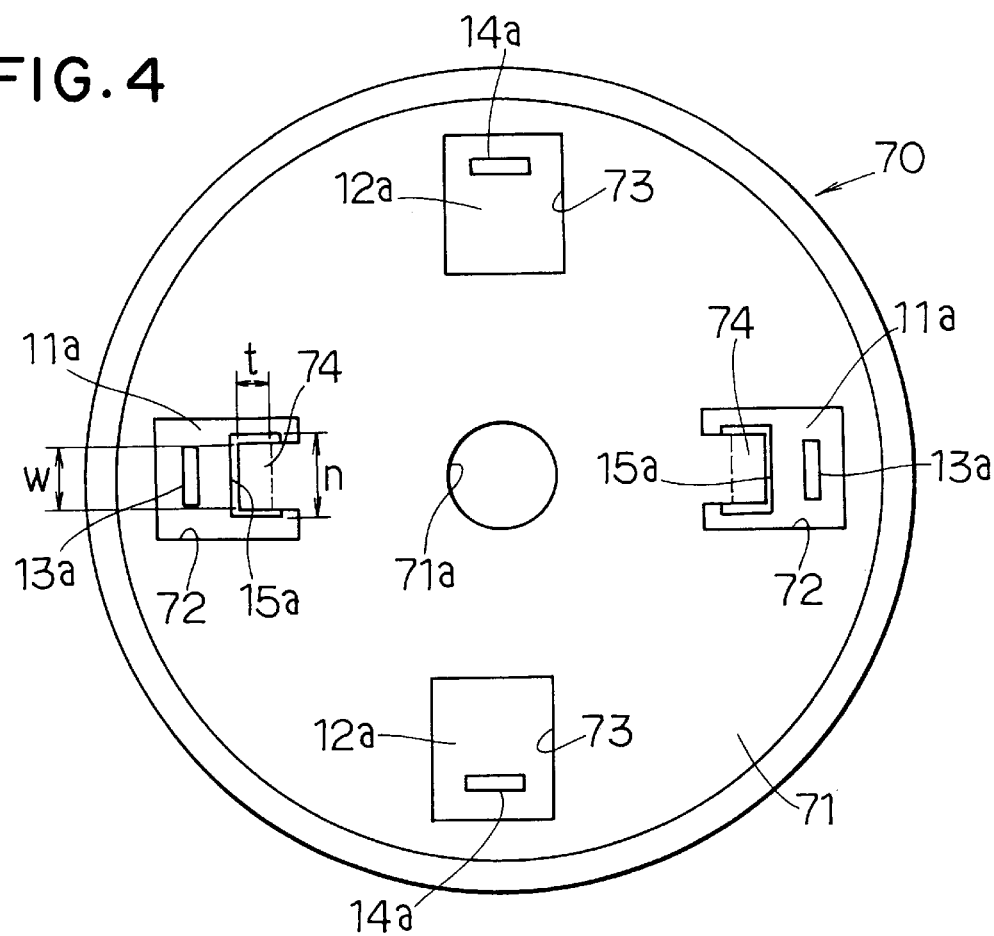
FIG. 4 is a bottom view of the magnetic shield casing shown in FIG. 3.

Magnetic shield casing 70 is a cup-shaped member made of soft magnetic material such as permalloy or nickel-ferrite alloy to provide a magnetic circuit for permanent magnet rotor 50 and to block magnetic noises. As shown in FIGS. 3 and 4, magnetic shield casing 70 has a pair of symmetrically disposed rectangular openings 72, and a pair of symmetrically disposed rectangular openings 73 about center hole 71a, at bottom 71 thereof. The line connecting the pair of openings 72 and the line connecting the pair of openings 73 cross each other at right angles.

Each of terminal holders 11 has projection 11a press-fitted to one of the pair of rectangular openings 72 at the bottom end thereof, and each of terminal holders 12 is press-fitted to one of the pair of rectangular openings 73 at bottom end 12a. Each of lower ends 13a of the pair of terminals 13 extends outward from one of bottom ends 11a of terminal holders 11, and each of lower ends 14a of the pair of terminals 14 extends outward from one of bottom ends 12a of terminal holders 12.

Magnetic shield casing 70 also has a pair of tongue-shaped magnetic projections 74 formed to align with the vertical axis of coil 20a as shown in FIGS. 1 and 2. Thus, projections 74 are disposed at a magnetically neutral position of coil 20a and at a magnetically maximum position of coil 20b. Because coil 20a is wound on coil 20b and weaker in the magnetic force than coil 20b, distortion of the magnetic field generated by cross-coil unit 20 is moderated to a level of practical use. For example, a difference in magnetic flux across permanent magnet rotor between coil 20a and coil 20b is about 5%, and magnetic projections 74 increase magnetic flux of coil 20a around projections 74 about 3%. Each of magnetic projections 74 extends from a portion around center hole 71a of bottom 71 upward inside shield casing 70, so that upper end 74 a thereof is inserted into one of rectangular cavities 15a formed at an outer circumference of cross-coil unit in bottom ends 11a of terminal holders 11. Thus, magnetic projections 74 and rectangular cavities 15a restrict relative rotation, and magnetic projections 74 can be disposed in dead spaces which are otherwise of no use, without increasing the size of magnetic shield casing 70.

In FIGS. 2 and 4, distance h between the bottom surface of permanent magnet rotor 50 and upper surface of upper end 74a of magnetic projection 74, radius r, thickness t and width w of magnetic projections 74, and width n of rectangular cavities 15a are arranged so that shield casing 70 can be fixed easily and surely.

Figures 5A, 5B:
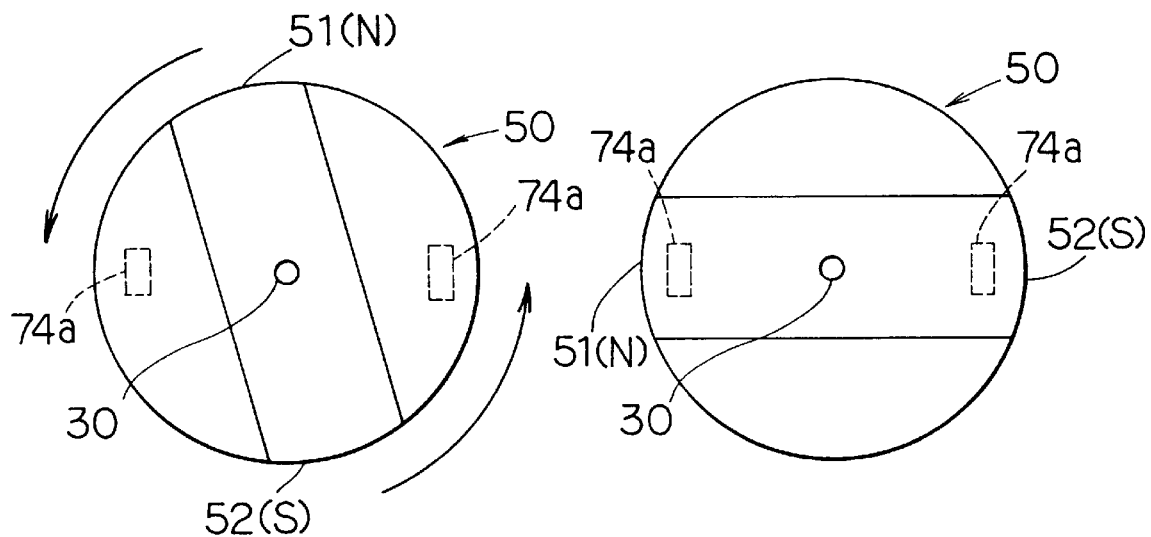
FIGS. 5A and 5B are schematic diagrams indicating position of a permanent magnet rotor and a pointer in operation.

If the drive circuit (not shown) energizes cross-coil unit 20 to generate zero-return magnetic field, permanent magnet rotor 50 rotates in the zero-return direction together with shaft 30 and pointer 60 as shown in FIG. 5A. When pointer 60 returns to the zero position, magnetic poles 51, 52 of permanent magnet rotor 50 meet magnetic projections 74 respectively as shown in FIG. 5B so that magnetic poles 51, 51 are short-circuited by magnetic projections 74 and other portions of magnetic shield member 70, and the drive circuit stops cross-coil unit 20 generating the zero-return magnetic field. Thus, permanent magnet rotor 50 is magnetically attracted by magnetic projections 74 to be restrained from rotating further.

The number and the shape of magnetic projections can be changed according to circumstances.

VARIATION

The present invention can be applied to a different structure of the cross-coil type indicating instrument.

Figure 6:
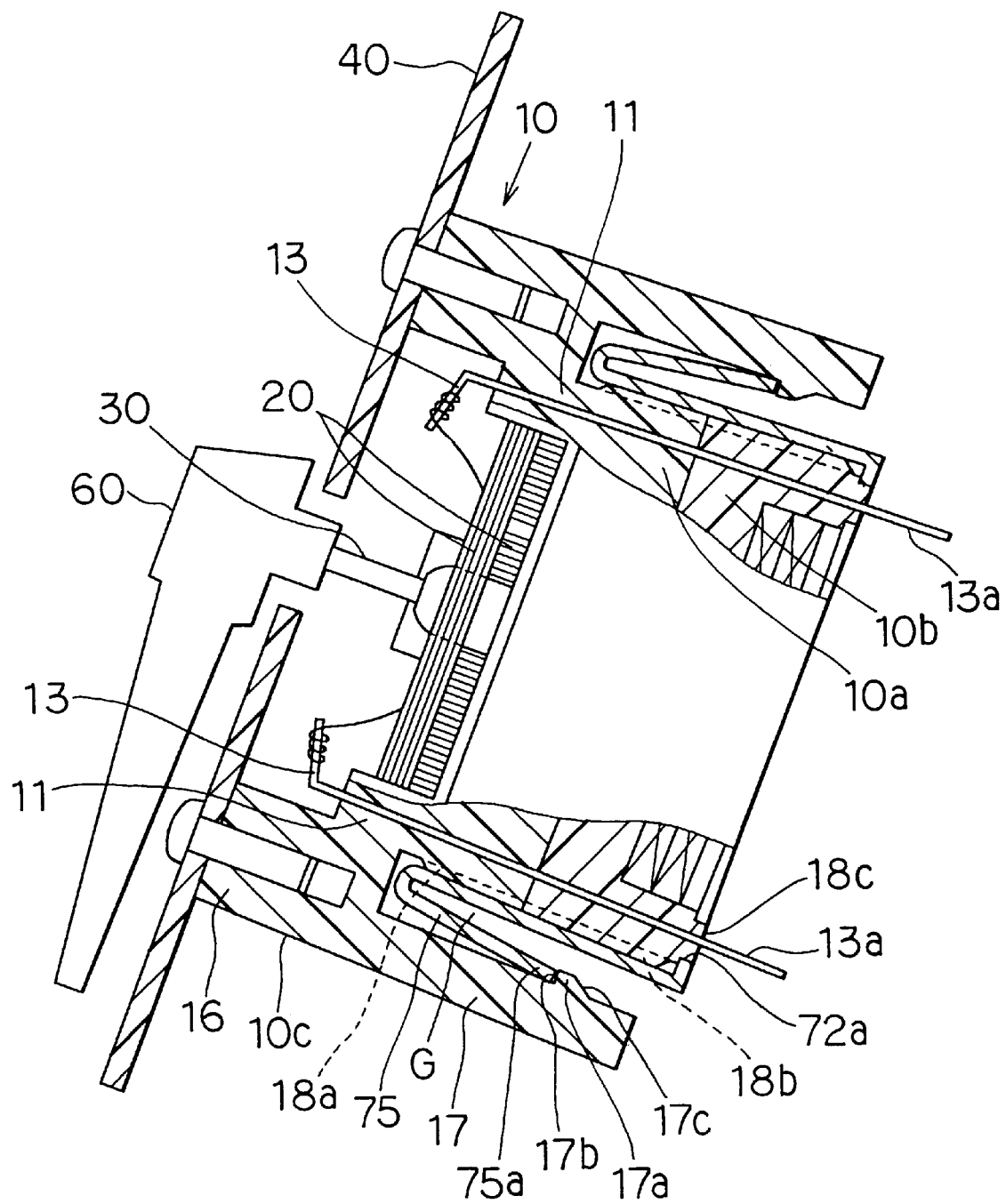
FIG. 6 is a cross-sectional view of a variation of the preferred embodiment.

In FIG. 6, bobbin 10 is composed of upper and lower bobbin members 10a, 10b. Upper bobbing member 10a has a pair of terminal holders 11 and a pair of L-shaped flanges 10c disposed symmetrically about shaft 30. Each of flanges 10c has pedestal portions 16 and hook portions 17. Pedestal portions 16 extend upward from upper end of terminal holders 11 to support dial 40. Hook portions 17 extend downward from the bottom of pedestal portions 16 along the outer periphery of bobbin members 10a, 10b at a certain space therefrom. Each of hook portions 17 has small projection 17a projecting into space G between hook portion 17 and the outer periphery of upper and lower bobbin members 10a, 10b. Small projection 17a has a flat engagement surface 17b at the upper portion thereof and an inclined guide surface 17c at the lower portion thereof. Upper and lower bobbin members 10a, log also have axially extending ridges 18a, 18b at peripheral portions thereof opposite hook portions 17. Ridges 18a, 18b increases the outside diameter of bobbin 10 slightly larger than the inside diameter of shield casing 70. Lower bobbin member 10b has also projection 18c at the bottom thereof.

Shield casing 70 has a pair of elastic overhang portions 75, which is compressed and inserted into space G along inclined guide surface 17c to engage hook portions 17. Each of overhang portions 75 has edge 75a in abutment with engagement surface 17b to prevent shield casing 70 from falling out. Shield casing 70 also has a plurality of rectangular openings 72a at the bottom thereof in engagement with projection 18c in a similar manner as the preferred embodiment. Other portions are substantially the same as portions denoted by same reference numerals in the first embodiment. Since overhang portions 75 do not engages with any portion other than engagement surface 17b, only axial pressure is applied to shield casing 70.

When assembled, bobbin 10 is press-fitted to shield casing 70 from the bottom side of lower bobbin member 10b until ring projection 18c engages with opening 72a, while causing plastic deformation of ridges 18a. Overhang portions 75a are compressed and inserted elastically into spaces G until edges 75a engage engagement surface 17b.

In the foregoing description of the present invention, the invention has been disclosed with reference to specific embodiments thereof. It will, however, be evident that various modifications and changes may be made to the specific embodiments of the present invention without departing from the broader spirit and scope of the invention as set forth in the appended claims. Accordingly, the description of the present invention in this document is to be regarded in an illustrative, rather than restrictive, sense.

What is claimed is:

1. A cross-coil type indicating instrument comprising:
    a housing being made of insulating material and having a housing bottom:
    a cross-coil unit disposed around said housing;
    a shaft coaxially and rotatably supported by said housing;
    a permanent magnet rotor having magnetic poles on the outer periphery thereof, said permanent magnet being disposed inside said housing and fixed to said shaft;
    a dial having a zero position;
    a pointer carried by said shaft at an end thereof for moving from and returning to said zero-position; and
    a cup-shaped magnetic shield casing having an open-end, a casing bottom and a peripheral wall for accommodating said housing, wherein
    said magnetic shield casing comprises a magnetic projection member extending from a portion of said casing bottom at a peripheral side of said cross-coil unit to meet one of said magnetic poles when said pointer returns to said zero-position.

2. The cross-coil type indicating instrument as claimed in claim 1, wherein
    said housing bottom has a cavity, and said magnetic projection member is fitted to said cavity.

3. The cross-coil type instrument as claimed in claim 2, said magnetic projection member is restricted by said opening of said housing bottom to move in the circumferential direction.

4. The cross-coil type indicating instrument as claimed in claim 2, wherein said housing comprises a plurality of terminal holders disposed at the outer periphery thereof and a plurality of electric terminals respectively held in said plurality of said terminal holder and connected to said cross-coil unit.

5. The cross-coil type indicating instrument as claimed in claim 4, wherein said shield casing has a plurality of openings at said casing bottom, and said housing has a plurality of projections at said housing bottom engaged with said openings of said casing bottom.

6. The cross-coil type indicating instrument as claimed in claim 1, wherein said housing bottom has a plurality of cavities disposed at symmetrical portions about said shaft, and said magnetic projection member comprises a plurality of tongue-shaped projections respectively fitted to said plurality of cavities.

7. The cross-coil type indicating instrument as claimed in claim 1, wherein said housing comprises a cylindrical body, a plurality of L-shaped flanges having hook members extending downward along said cylindrical body at a space, said shield casing comprises a pair of elastic members extending upward to be inserted between said hook members and said cylindrical body, whereby said shield casing is fixed to said housing without additional fixing member.

8. The cross-coil type indicating instrument as claimed in claim 7, wherein said housing has ridges at portions of said cylindrical body opposite said hook members.

9. The cross-coil type indicating instrument as claimed in claim 8, wherein said shield casing has a plurality of openings at said casing bottom, and said housing has a plurality of projections at said housing bottom engaged with said openings of said casing bottom.

10. The cross-coil type indicating instrument as claimed in claim 1, wherein said cross coil unit comprises a first coil wound around a first axis and a second coil wound around a second axis perpendicular to said first axis and on said first coil, and said magnetic projection member is disposed to align with said second axis.

* * * * *